United States Patent
Hamasaki

(10) Patent No.: US 11,394,366 B2
(45) Date of Patent: Jul. 19, 2022

(54) ACOUSTIC WAVE FILTER AND MULTIPLEXER

(71) Applicant: TAIYO YUDEN CO., LTD., Tokyo (JP)

(72) Inventor: Jyunichi Hamasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/962,674

(22) Filed: Apr. 25, 2018

(65) Prior Publication Data

US 2018/0337655 A1    Nov. 22, 2018

(30) Foreign Application Priority Data

May 18, 2017  (JP) .............................. JP2017-099254

(51) Int. Cl.
*H03H 9/02*     (2006.01)
*H03H 9/72*     (2006.01)
(Continued)

(52) U.S. Cl.
CPC .... *H03H 9/02834* (2013.01); *H03H 9/02559* (2013.01); *H03H 9/02724* (2013.01);
(Continued)

(58) Field of Classification Search
CPC ........... H03H 9/02834; H03H 9/02559; H03H 9/02724; H03H 9/14552; H03H 9/25; H03H 9/6483; H03H 9/725
See application file for complete search history.

(56) References Cited

U.S. PATENT DOCUMENTS

| | | | |
|---|---|---|---|
| 2002/0093399 A1* | 7/2002 | Takata | H03H 9/6483 333/193 |
| 2007/0030094 A1* | 2/2007 | Omote | H03H 9/02559 333/133 |

(Continued)

FOREIGN PATENT DOCUMENTS

| | | |
|---|---|---|
| JP | 2008-508821 A | 3/2008 |
| JP | 2012-175315 A | 9/2012 |

(Continued)

OTHER PUBLICATIONS

Japanese Office Action dated Mar. 9, 2021, in a counterpart Japanese patent application No. 2017-099254. (A machine translation (not reviewed for accuracy) attached.).

(Continued)

*Primary Examiner* — Samuel S Outten
(74) *Attorney, Agent, or Firm* — Chen Yoshimura LLP

(57) ABSTRACT

An acoustic wave filter includes: a piezoelectric substrate; series resonators connected in series and located on the piezoelectric substrate, each of the series resonators including first electrode fingers that are arranged with a first duty ratio and excite an acoustic wave; parallel resonators connected in parallel and located on the piezoelectric substrate, each of the parallel resonators including second electrode fingers that are arranged with a second duty ratio and excite an acoustic wave, the second duty ratio in at least one parallel resonator being less than the first duty ratio in at least one series resonator; and a dielectric film that has a temperature coefficient of elastic modulus that is opposite in sign to that of the piezoelectric substrate, is located on the piezoelectric substrate so as to cover the first and second electrode fingers, has a film thickness greater than those of the first and second electrode fingers.

19 Claims, 14 Drawing Sheets

| RESONATOR | DUTY RATIO[%] | PITCH[μm] | NUMBER OF PAIRS IN IDT | NUMBER OF PAIRS IN REFLECTOR | APERTURE LENGTH[λ] |
|---|---|---|---|---|---|
| S1 | 50 | 4.415 | 31 | 10 | 23.6 |
| S2 | 50 | 4.417 | 28.5 | 10 | 16.6 |
| S3 | 50 | 4.453 | 47.5 | 10 | 29.2 |
| S4 | 50 | 4.423 | 29 | 10 | 30.0 |
| S5 | 50 | 4.230 | 63 | 10 | 20.3 |
| P1 | 50 | 4.555 | 60 | 10 | 34.9 |
| P2 | 50 | 4.608 | 76 | 10 | 27.0 |
| P3 | 50 | 4.484 | 25 | 10 | 24.0 |
| P4 | 50 | 4.540 | 54 | 10 | 29.2 |

(51) Int. Cl.
  *H03H 9/25* (2006.01)
  *H03H 9/64* (2006.01)
  *H03H 9/145* (2006.01)

(52) U.S. Cl.
  CPC .......... *H03H 9/14552* (2013.01); *H03H 9/25* (2013.01); *H03H 9/6483* (2013.01); *H03H 9/725* (2013.01)

(56) References Cited

U.S. PATENT DOCUMENTS

| | | |
|---|---|---|
| 2007/0241841 A1 | 10/2007 | Hauser et al. |
| 2013/0021116 A1 | 1/2013 | Sogoya et al. |
| 2013/0300519 A1 | 11/2013 | Tamasaki et al. |
| 2014/0361850 A1* | 12/2014 | Inoue .................. H03H 9/6433 333/133 |
| 2016/0285431 A1 | 9/2016 | Nakahashi et al. |
| 2019/0190494 A1* | 6/2019 | Nosaka ................ H03H 9/1457 |

FOREIGN PATENT DOCUMENTS

| | | |
|---|---|---|
| JP | 2012-186642 A | 9/2012 |
| JP | 2013-145930 A | 7/2013 |
| JP | 2016-184900 A | 10/2016 |
| WO | 2011/142143 A1 | 11/2011 |
| WO | 2012/098816 A1 | 7/2012 |

OTHER PUBLICATIONS

Japanese Office Action dated Jun. 1, 2021, in a counterpart Japanese patent application No. 2017-099254. (A machine translation (not reviewed for accuracy) attached.).

* cited by examiner

FIG. 5

| RESONATOR | DUTY RATIO[%] | PITCH[μm] | NUMBER OF PAIRS IN IDT | NUMBER OF PAIRS IN REFLECTOR | APERTURE LENGTH[λ] |
|---|---|---|---|---|---|
| S1 | 50 | 4.415 | 31 | 10 | 23.6 |
| S2 | 50 | 4.417 | 28.5 | 10 | 16.6 |
| S3 | 50 | 4.453 | 47.5 | 10 | 29.2 |
| S4 | 50 | 4.423 | 29 | 10 | 30.0 |
| S5 | 50 | 4.230 | 63 | 10 | 20.3 |
| P1 | 50 | 4.555 | 60 | 10 | 34.9 |
| P2 | 50 | 4.608 | 76 | 10 | 27.0 |
| P3 | 50 | 4.484 | 25 | 10 | 24.0 |
| P4 | 50 | 4.540 | 54 | 10 | 29.2 |

FIG. 8

| RESONATOR | DUTY RATIO[%] | PITCH[μm] | NUMBER OF PAIRS IN IDT | NUMBER OF PAIRS IN REFLECTOR | APERTURE LENGTH[λ] |
|---|---|---|---|---|---|
| A1 | 60 | 4.35 | 30 | 10 | 30 |
| A2 | 60 | 4.53 | 30 | 10 | 30 |
| A3 | 60 | 4.71 | 30 | 10 | 30 |
| B1 | 50 | 4.35 | 30 | 10 | 30 |
| B2 | 50 | 4.53 | 30 | 10 | 30 |
| B3 | 50 | 4.71 | 30 | 10 | 30 |
| C1 | 40 | 4.35 | 30 | 10 | 30 |
| C2 | 40 | 4.53 | 30 | 10 | 30 |
| C3 | 40 | 4.71 | 30 | 10 | 30 |

FIG. 10

| RESONATOR | DUTY RATIO[%] | PITCH[μm] | NUMBER OF PAIRS IN IDT | NUMBER OF PAIRS IN REFLECTOR | APERTURE LENGTH[λ] |
|---|---|---|---|---|---|
| S1 | 50 | 4.415 | 31 | 10 | 23.6 |
| S2 | 50 | 4.417 | 28.5 | 10 | 16.6 |
| S3 | 50 | 4.453 | 47.5 | 10 | 29.2 |
| S4 | 50 | 4.423 | 29 | 10 | 30.0 |
| S5 | 50 | 4.230 | 63 | 10 | 20.3 |
| P1 | 40 | 4.597 | 60 | 10 | 34.9 |
| P2 | 40 | 4.651 | 76 | 10 | 27.0 |
| P3 | 40 | 4.526 | 25 | 10 | 24.0 |
| P4 | 40 | 4.582 | 54 | 10 | 29.2 |

# ACOUSTIC WAVE FILTER AND MULTIPLEXER

CROSS-REFERENCE TO RELATED APPLICATION

This application is based upon and claims the benefit of priority of the prior Japanese Patent Application No. 2017-099254, filed on May 18, 2017, the entire contents of which are incorporated herein by reference.

FIELD

A certain aspect of the present invention relates to an acoustic wave filter and a multiplexer.

BACKGROUND

In communication systems as typified by mobile phones, acoustic wave filters have been used to remove unnecessary signals other than signals in the frequency band used for communication. There has been known as the acoustic wave filter a filter including a surface acoustic wave (SAW) resonator having an interdigital transducer (IDT), which has electrode fingers, formed on a piezoelectric substrate.

A stable acoustic wave filter is achieved by reducing the temperature coefficient of frequency (TCF) of the resonant frequency or the like of the surface acoustic wave resonator. Thus, it has been known to provide, on the electrode fingers, a dielectric film having a temperature coefficient of elastic modulus that is opposite in sign to that of the piezoelectric substrate as disclosed in, for example, International Publication No. 2012/098816 (Patent Document 1) and Japanese Patent Application Publication Nos. 2012-175315 and 2013-145930 (Patent Documents 2 and 3, respectively).

For example, Patent Documents 1 and 2 disclose that the film thickness of the dielectric film is made to be different between a series resonator and a parallel resonator of the ladder-type filter. It has been known to make the duty ratio of one of the parallel resonator and the series resonator that has a larger film thickness of the dielectric film less than the duty ratio of the other.

SUMMARY OF THE INVENTION

According to a first aspect of the present invention, there is provided an acoustic wave filter including: a piezoelectric substrate; one or more series resonators that are connected in series between an input terminal and an output terminal and located on the piezoelectric substrate, each of the one or more series resonators including first electrode fingers that are arranged with a first duty ratio and excite an acoustic wave; one or more parallel resonators that are connected in parallel between the input terminal and the output terminal and located on the piezoelectric substrate, each of the one or more parallel resonators including second electrode fingers that are arranged with a second duty ratio and excite an acoustic wave, the second duty ratio in at least one parallel resonator of the one or more parallel resonators being less than the first duty ratio in at least one series resonator of the one or more series resonators; and a dielectric film that has a temperature coefficient of elastic modulus that is opposite in sign to that of the piezoelectric substrate, is located on the piezoelectric substrate so as to cover the first electrode fingers and the second electrode fingers, has a film thickness greater than those of the first electrode fingers and the second electrode fingers.

According to a second aspect of the present invention, there is provided an acoustic wave filter including: a piezoelectric substrate; one or more series resonators that are connected in series between an input terminal and an output terminal and located on the piezoelectric substrate, each of the one or more series resonators including first electrode fingers that are arranged with a first duty ratio and excite an acoustic wave; one or more parallel resonators that are connected in parallel between the input terminal and the output terminal and located on the piezoelectric substrate, each of the one or more parallel resonators including second electrode fingers that are arranged with a second duty ratio and excite an acoustic wave, the second duty ratio in at least one parallel resonator of the one or more parallel resonators being less than the first duty ratio in at least one series resonator of the one or more series resonators; a first dielectric film that has a temperature coefficient of elastic modulus that is opposite in sign to that of the piezoelectric substrate, is located on the piezoelectric substrate so as to cover the first electrode fingers, and has a first film thickness greater than those of the first electrode fingers; and a second dielectric film that has a temperature coefficient of elastic modulus that is opposite in sign to that of the piezoelectric substrate, is located on the piezoelectric substrate so as to cover the second electrode fingers, and has a second film thickness that is greater than those of the second electrode fingers and is substantially equal to the first film thickness.

According to a third aspect of the present invention, there is provided a multiplexer including: the acoustic wave filter

BRIEF DESCRIPTION OF THE DRAWINGS

FIG. 5 presents the conditions of each resonator of a first comparative example;

FIG. 8 presents the conditions of resonators fabricated in a first experiment;

FIG. 10 presents the conditions of each resonator in a first embodiment;

DETAILED DESCRIPTION

The reduction of the temperature coefficient of frequency is insufficient even when the dielectric film having a temperature coefficient of elastic modulus that is opposite in sign to the temperature coefficient of the elastic modulus of the piezoelectric substrate is provided on the electrode fingers.

Figure 1A:
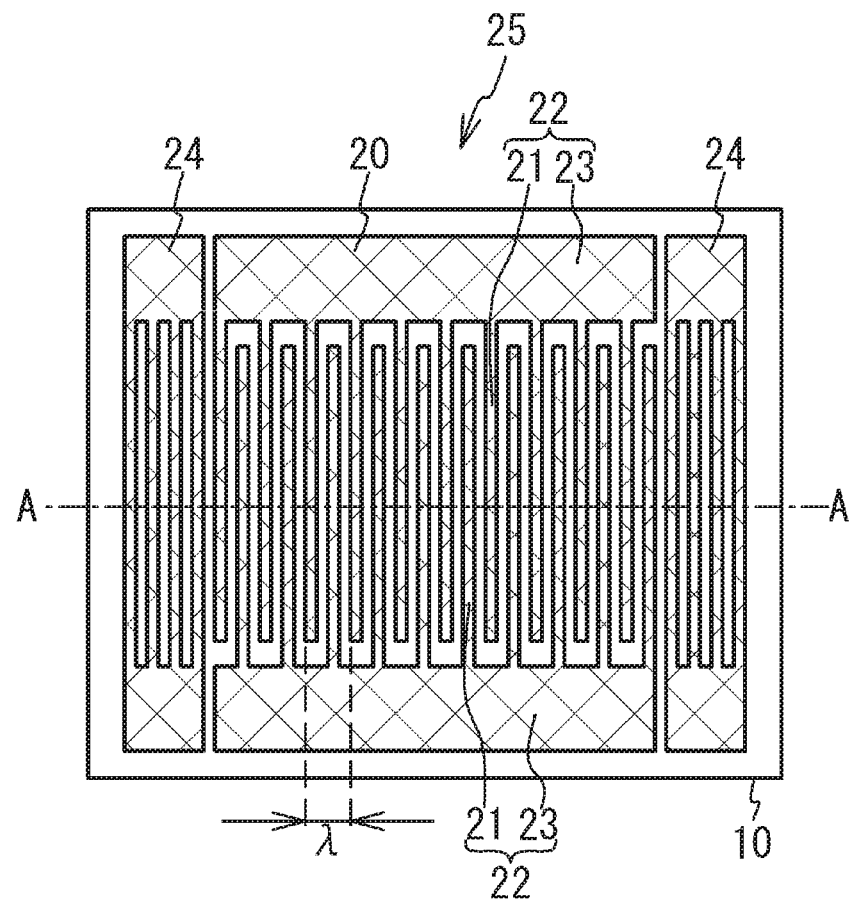
FIG. 1A is a plan view of a surface acoustic wave resonator in embodiments and comparative examples.
Figure 1B:
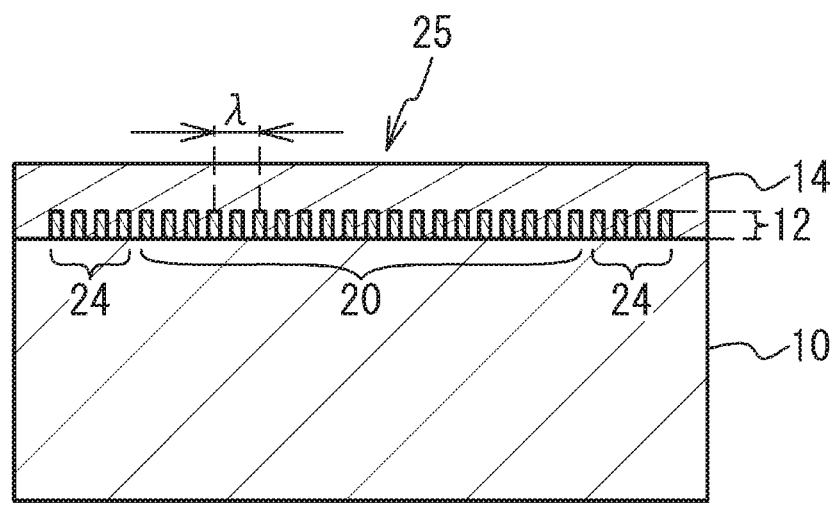
FIG. 1B is a cross-sectional view taken along line A-A in FIG. 1A.

FIG. 1A is a plan view of a surface acoustic wave resonator in embodiments and comparative examples, and FIG. 1B is a cross-sectional view taken along line A-A in FIG. 1A. As illustrated in FIG. 1A and FIG. 1B, in one-port resonator 25, an IDT 20 and reflectors 24 are formed on a piezoelectric substrate 10. The IDT 20 and the reflectors 24 are formed of a metal film 12 formed on the piezoelectric substrate 10. The IDT 20 includes a pair of comb-shaped electrodes 22 facing each other. The comb-shaped electrode 22 includes electrode fingers 21 and a bus bar 23 to which the electrode fingers 21 are connected. A pair of the comb-shaped electrodes 22 are arranged to face each other so that the electrode fingers 21 of one of the comb-shaped electrodes 22 and the electrode fingers 21 of the other are substantially alternately arranged.

The acoustic wave excited by the electrode fingers 21 of a pair of the comb-shaped electrodes 22 propagates in the arrangement direction of the electrode fingers 21. The pitch λ of the electrode fingers 21 of one of the comb-shaped electrodes 22 substantially corresponds to the wavelength of the acoustic wave. The reflectors 24 reflect the acoustic wave. This structure confines the energy of the acoustic wave in the IDT 20. A dielectric film 14 is located on the piezoelectric substrate 10 so as to cover the electrode fingers 21. The film thickness of the dielectric film 14 is greater than the film thickness of the metal film 12. The piezoelectric substrate 10 is, for example, a lithium tantalate substrate or a lithium niobate substrate. The metal film 12 is, for example, an aluminum film or a copper film. The dielectric film 14 is, for example, a silicon oxide film (to which an element such as fluorine may be added). When the materials exemplified above are used, the temperature coefficient of frequency (for example, the temperature coefficient of the resonant frequency) of the piezoelectric substrate 10 is negative. On the other hand, the temperature coefficient of frequency of the dielectric film 14 is positive. More specifically, the temperature coefficient of the elastic modulus of the piezoelectric substrate 10 is opposite in sign to the temperature coefficient of the elastic modulus of the dielectric film 14. Thus, the provision of the dielectric film 14 enables to make the temperature coefficient of frequency close to 0.

Figure 2A:
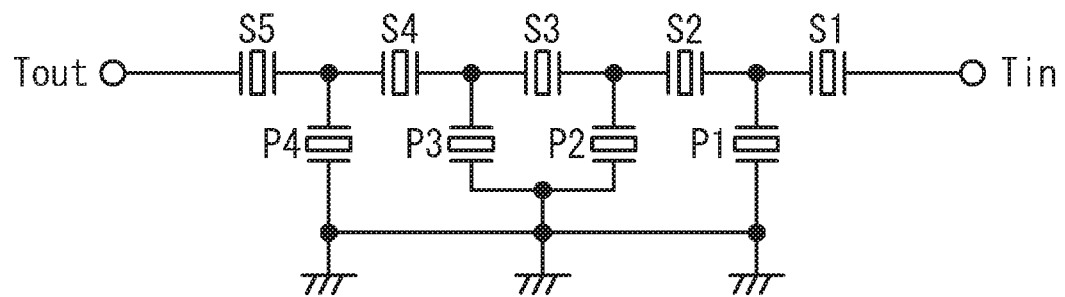
FIG. 2A is a circuit diagram of an acoustic wave filter in the embodiments and the comparative examples.
Figure 2B:
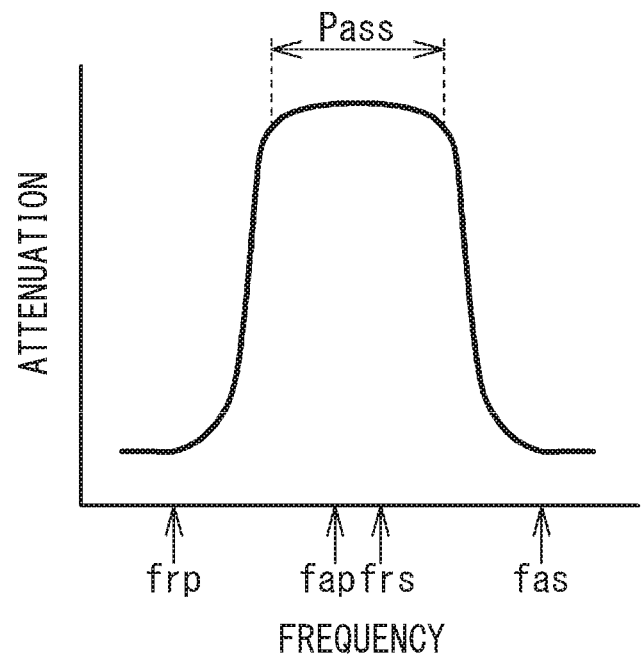
FIG. 2B illustrates the transmission characteristic of a ladder-type filter.

FIG. 2A is a circuit diagram of an acoustic wave filter in the embodiments and the comparative examples, and FIG. 2B illustrates the transmission characteristic of a ladder-type filter. As illustrated in FIG. 2A, in a ladder-type filter, series resonators S1 through S5 are connected in series and parallel resonators P1 through P4 are connected in parallel between an input terminal Tin and an output terminal Tout. First ends of the parallel resonators P1 through P4 are coupled to ground terminals.

As illustrated in FIG. 2B, the ladder-type filter functions as a bandpass filter. The resonant frequency frs of each of the series resonators S1 through S5 is located within the passband Pass, and the antiresonant frequency fas is located in an attenuation range higher in frequency than the passband Pass. The resonant frequency frp of each of the parallel resonators P1 through P4 is located in an attenuation range lower in frequency than the passband Pass, and the resonant frequency fap is located inside the passband Pass.

Figure 3:
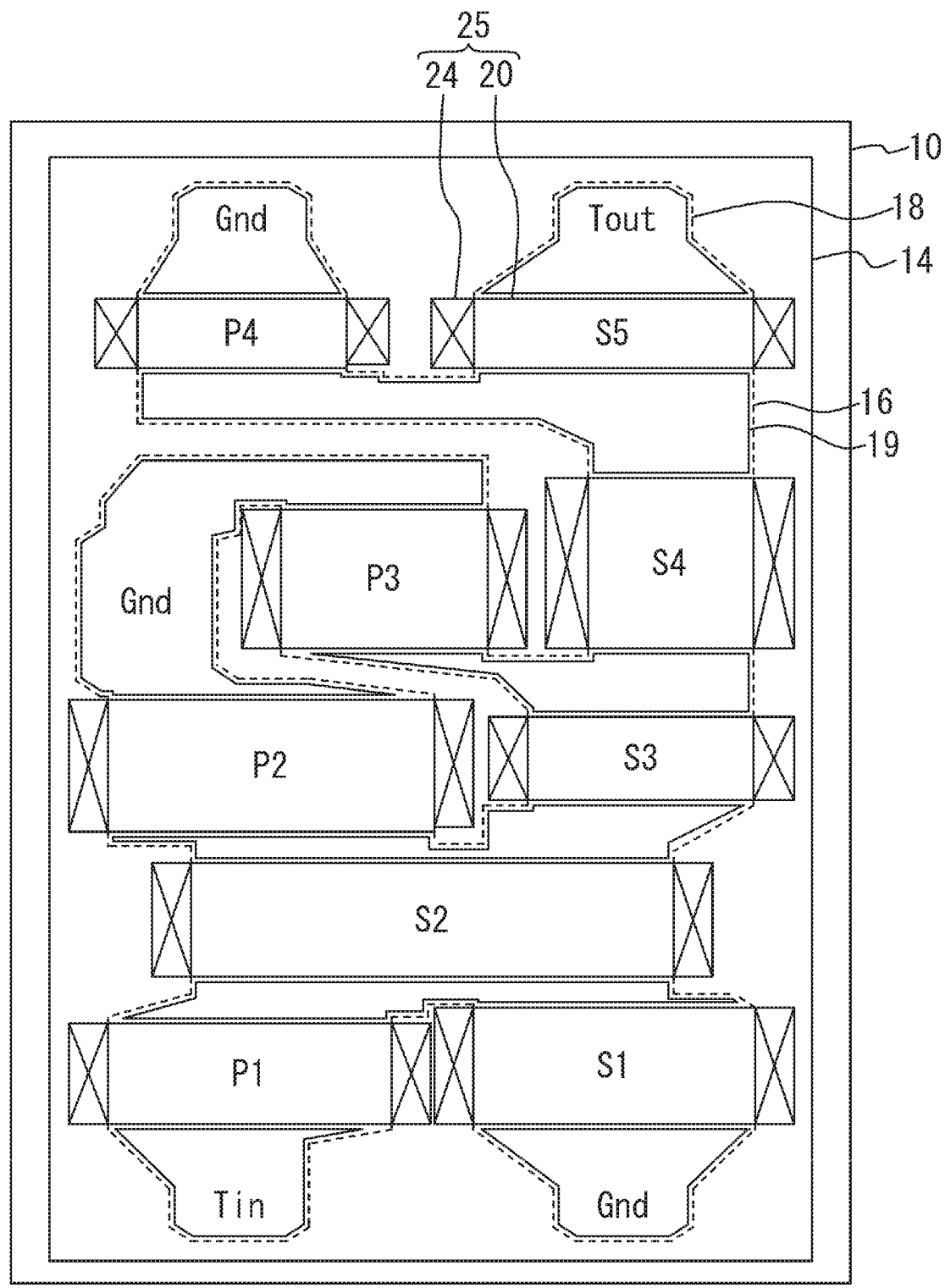
FIG. 3 is a plan view of an acoustic wave filter in the embodiments and the comparative examples.

FIG. 3 is a plan view of an acoustic wave filter in the embodiments and the comparative examples. As illustrated in FIG. 3, the surface acoustic wave resonators 25, wiring lines 16, and pads 18 are located on the piezoelectric substrate 10. The surface acoustic wave resonators 25 are indicated by solid lines, and the wiring lines 16 and the pads 18 are indicated by dashed lines. The surface acoustic wave resonators 25 correspond to the series resonators S1 through S5 and the parallel resonators P1 through P4. The pads 18 correspond to the input terminal Tin, the output terminal Tout, and ground terminals Gnd. The wiring lines 16 electrically interconnect the surface acoustic wave resonators 25. Apertures 19 of the dielectric film 14 are located above the wiring lines 16 and the pads 18. This is, for example, for forming an additional metal film to reduce a wiring resistance on the pad 18 and/or for adding bumps for implementation. The wiring lines 16 and the pads 18 are formed of a metal film including an aluminum film, a copper film, or a gold film.

Figure 4:
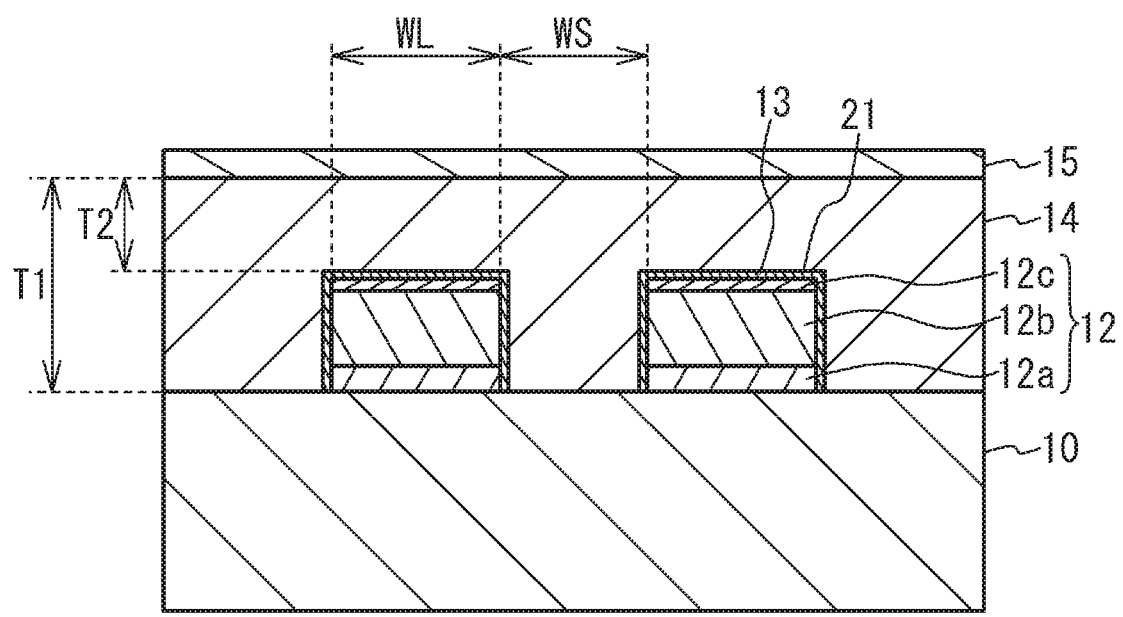
FIG. 4 is a cross-sectional view around electrode fingers in the embodiments and the comparative examples.

FIG. 4 is a cross-sectional view around electrode fingers in the embodiments and the comparative examples. As illustrated in FIG. 4, the metal film 12 includes metal films 12a, 12b, and 12c stacked in this order from the piezoelectric substrate 10 side. A protective film 13 is located on the side surfaces and the upper surface of the electrode finger 21. The upper surface of the dielectric film 14 is flat. A frequency adjusting film 15 is located on the dielectric film 14. The frequency adjusting film 15 is a film that adjusts the resonant frequency or the like of the surface acoustic wave resonator. The width of the electrode finger 21 is represented by WL, and the gap between the electrode fingers 21 is represented by WS. The duty ratio of the electrode fingers 21 is represented by WL/(WL+WS). The film thickness from the upper surface of the piezoelectric substrate 10 to the upper surface of the dielectric film 14 is represented by T1, and the film thickness from the upper surface of the protective film 13 on the electrode finger 21 to the upper surface of the dielectric film 14 is represented by T2. The metal film 12 has a three-layer structure, but the metal film 12 may be a single film or a plurality of multilayered films. The protective film 13 and/or the frequency adjusting film 15 may not be necessarily provided.

First Comparative Example

An acoustic wave filter in accordance with a first comparative example was fabricated. The fabrication conditions are as follows.
Piezoelectric substrate 10: 125° rotated Y-cut X-propagation lithium niobate substrate with a film thickness of 250 μm
Metal film 12a: Ti film with a film thickness of 78 nm
Metal film 12b: Cu film with a film thickness of 215 nm
Metal film 12c: Cr film with a film thickness of 10 nm
Protective film 13: Silicon nitride film with a film thickness of 20 nm
Dielectric film 14: SiO$_2$ film with a film thickness T1 of 1720 nm and a film thickness T2 of 1417 nm
Frequency adjusting film 15: Niobium oxide film with a film thickness of 10 to 20 nm
The primary mode of the surface acoustic wave resonator is a Rayleigh wave.

FIG. 5 presents the conditions of each resonator of the first comparative example. As illustrated in FIG. 5, the duty ratio in each of the series resonators S1 through S5 and the parallel resonators P1 through P4 is 50%. The number of pairs in the reflector is 10 pairs and the same among the resonators. The pitch, the number of pairs in the IDT, and the aperture length differ among the resonators.

Figure 6:
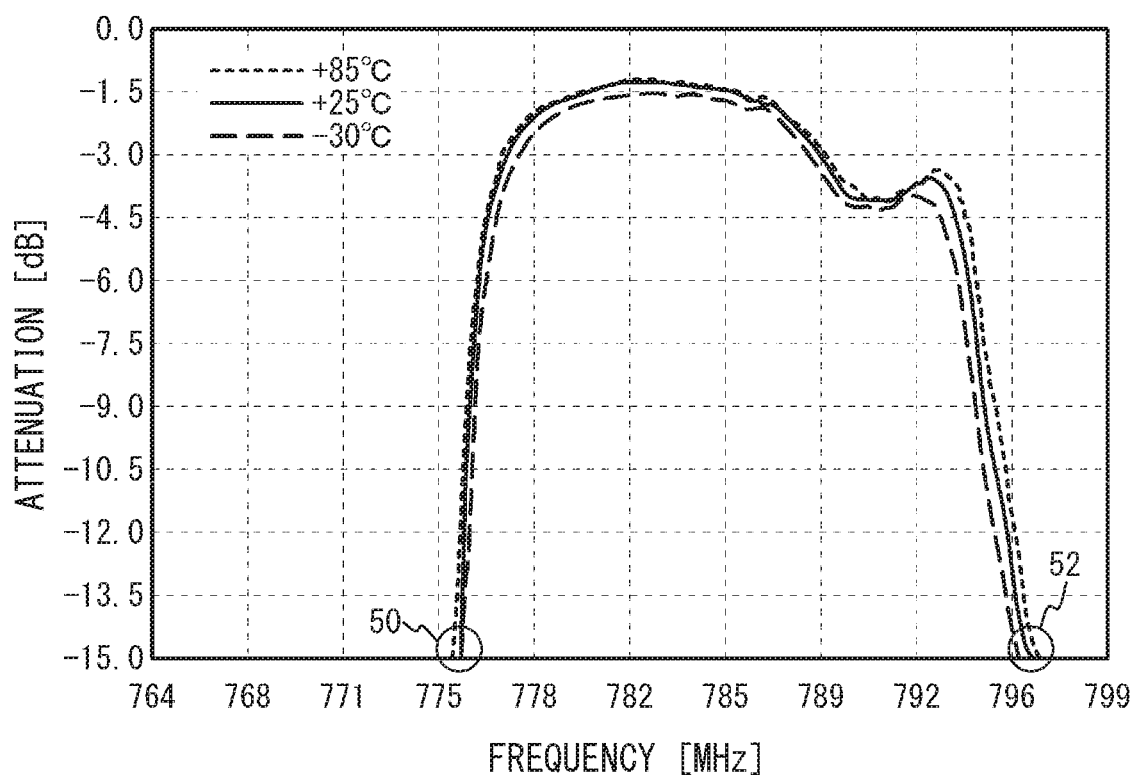
FIG. 6 illustrates the transmission characteristic of the acoustic wave filter in the first comparative example.

FIG. 6 illustrates the transmission characteristics of the acoustic wave filter of the first comparative example. As illustrated in FIG. 6, the transmission characteristics at temperatures of −30° C., +25° C., and +85° C. were measured. A lower-frequency end 50 (the region where the attenuation is −15 dB) of the passband shifts to a lower frequency as the temperature increases (that is, the TCF is negative). A higher-frequency end 52 (the region where the attenuation is −15 dB) of the passband shifts to a higher frequency as the temperature increases (that is, the TCF is positive). As described above, the temperature coefficient of frequency is large.

Figure 7:
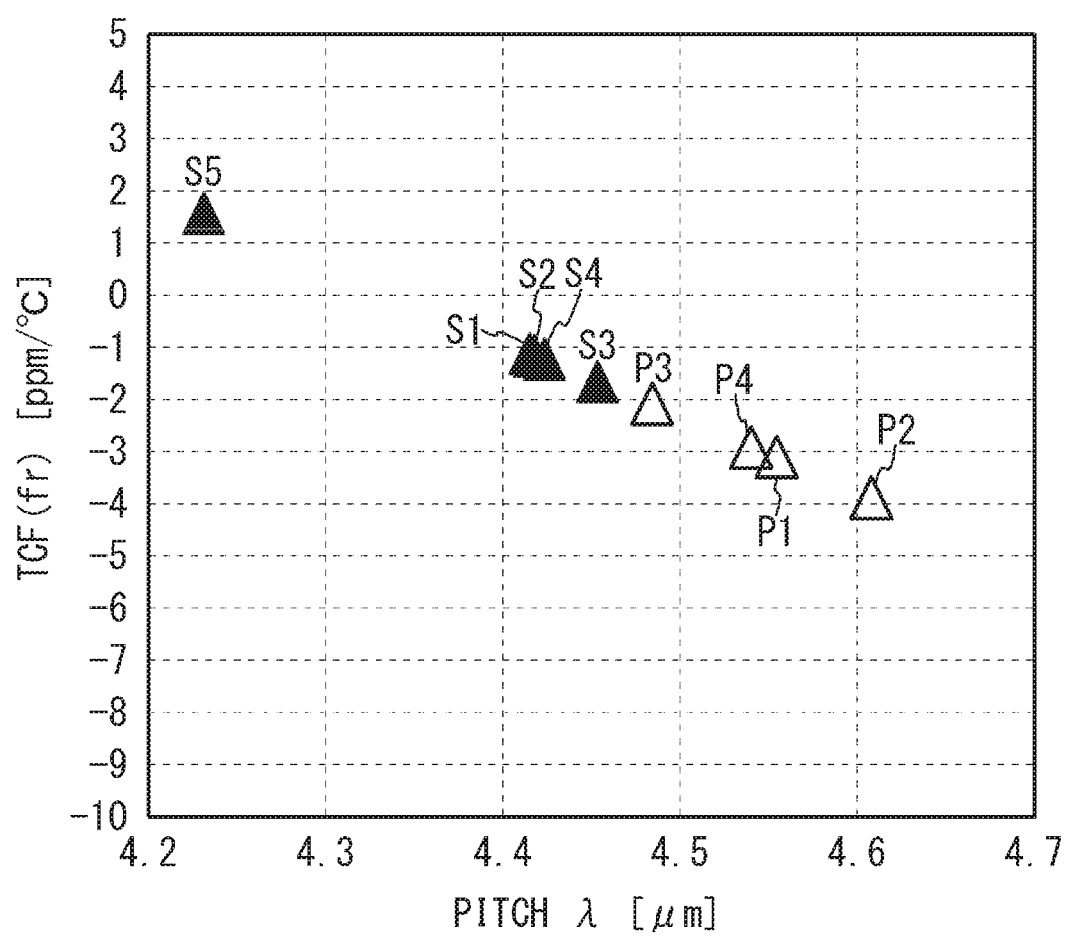
FIG. 7 is a graph of the TCF of the resonant frequency fr versus the pitch of each resonator in the first comparative example.

FIG. 7 illustrates the TCF at the resonant frequency fr with respect to the pitch of each resonator in the first comparative example. As illustrated in FIG. 7, the pitch differs among the series resonators S1 through S5, and the pitch differs among the parallel resonators P1 through P4. The pitches in the series resonators S1 through S5 are less than the pitches in the parallel resonators P1 through P4. The TCF(fr) (the TCF at the resonant frequency) of each of the series resonators S1 through S5 is greater than the TCF(fr) of each of the parallel resonators P1 through P4. The relation between the pitch and the TCF(fr) is substantially linear.

The TCF at the resonant frequency of the surface acoustic wave resonator is proportional to the ratio H/λ, which is the ratio of the film thickness H to the pitch λ, wherein λ represents the pitch of the electrode fingers of the IDT 20 and H represents the film thickness of the metal film 12. When the film thickness H of the metal film 12 is the same, the TCF is inversely proportional to the pitch λ as illustrated in FIG. 7. As illustrated in FIG. 2B, in the ladder-type filter, the series resonator has a higher resonant frequency than the parallel resonator. Thus, the pitch in the series resonator is less than the pitch in the parallel resonator. This is considered the reason why the TCF in the higher-frequency end, which is mainly formed by the series resonators, is positive and the TCF in the lower-frequency end, which is mainly formed by the parallel resonators, is negative.

Making the film thickness of the dielectric film 14 different between the series resonators S1 through S5 and the parallel resonators P1 through P4 is considered one way of securing the difference in TCF between the higher-frequency end and the lower-frequency end due to the difference in pitch between the series resonator and the parallel resonator. However, making the film thickness of the dielectric film 14 different increases the number of fabrication steps, thus increasing the cost. Thus, it was examined whether the TCF is controlled with the duty ratio of the electrode fingers 21 by conducting a following first experiment.

First Experiment

FIG. 8 presents the conditions of resonators fabricated in the first experiment. Unlike the first comparative example, the upper surface of the dielectric film 14 is not planarized. Other conditions are the same as those of the first comparative example. As presented in FIG. 8, the number of pairs in the IDT, the number of pairs in the reflector, and the aperture length are the same among the resonators. The duty ratio is 60% in the resonators A1 through A3, 50% in the resonators B1 through B3, and 40% in the resonators C1 through C3.

Figure 9:
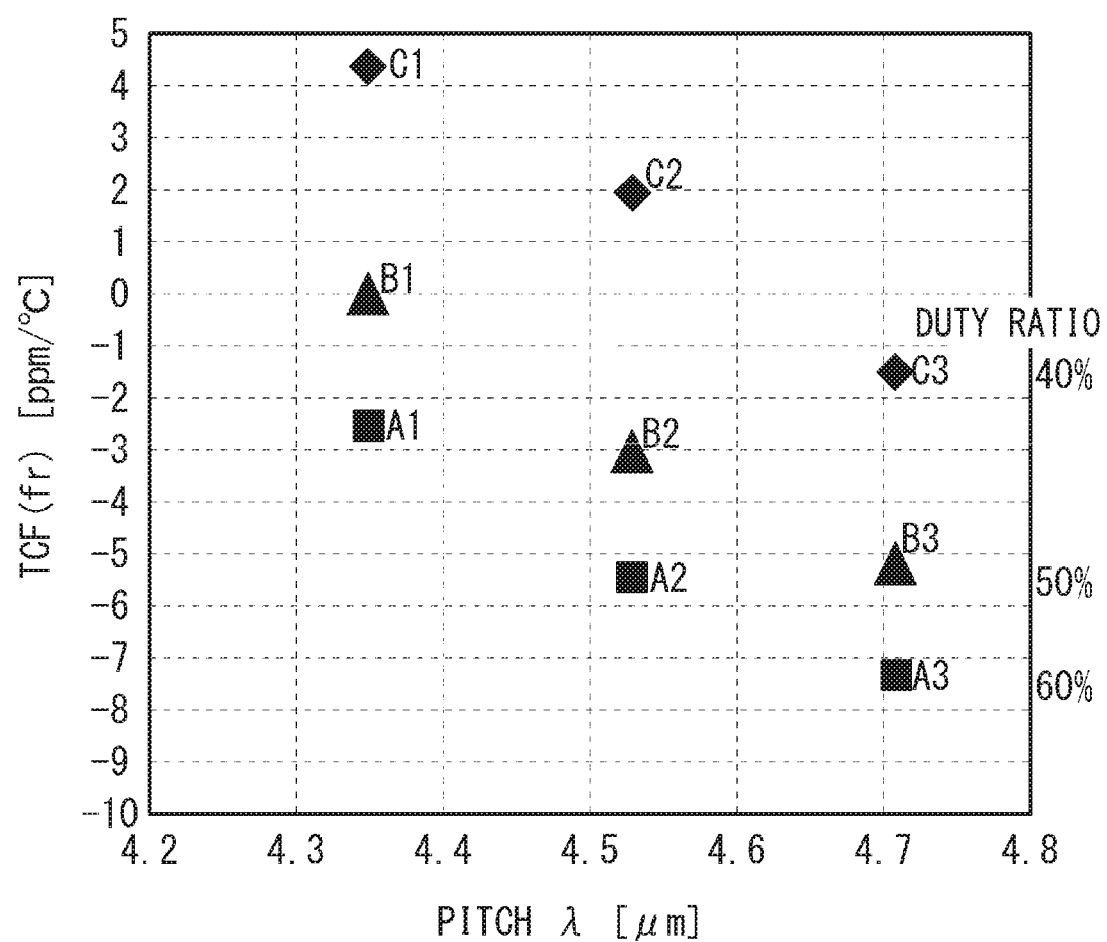
FIG. 9 is a graph of the TCF(fr) versus the pitch of each resonator in the first experiment.

FIG. 9 presents the TCF(fr) with respect to the pitch in each resonator in the first experiment. As presented in FIG. 9, as the duty ratio is increased, the TCF(fr) shifts toward a positive value. Even when the duty ratio varies, the rate of the TCF(fr) to the pitch is substantially the same. As described above, the TCF is able to be adjusted by changing the duty ratio.

Embodiments based on the result of the first experiment will be described.

First Embodiment

An acoustic wave filter in accordance with a first embodiment was fabricated. FIG. 10 presents the conditions of each resonator in the first embodiment. As presented in FIG. 10, the duty ratio in each of the series resonators S1 through S5 was set as 50%, and the duty ratio in each of the parallel resonators P1 through P4 was set as 40%. Other conditions are the same as those of the first comparative example, and the description thereof is thus omitted.

Figure 11:
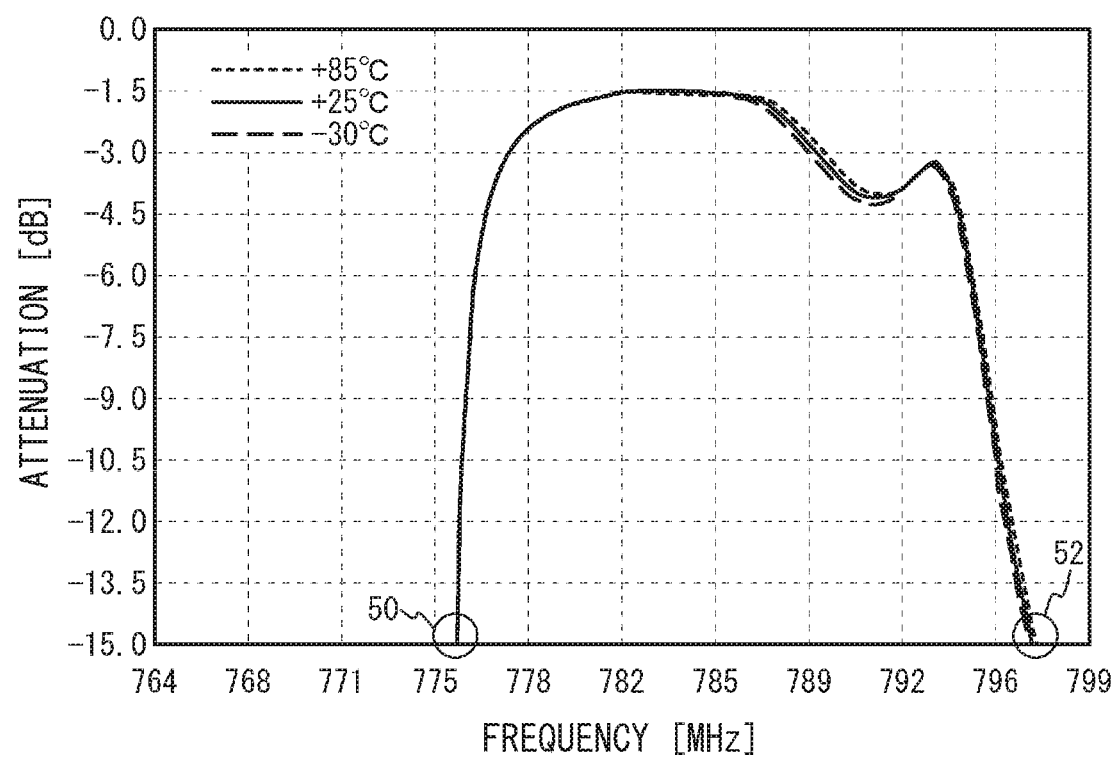
FIG. 11 illustrates the transmission characteristic of the acoustic wave filter in the first embodiment.

FIG. 11 illustrates the transmission characteristics of the acoustic wave filter in the first embodiment. As illustrated in FIG. 11, transmission characteristics at temperatures of −30° C., +25° C., and +85° C. were measured. The lower-frequency end 50 and the higher-frequency end 52 of the passband were substantially the same regardless of the temperature.

Figure 12:
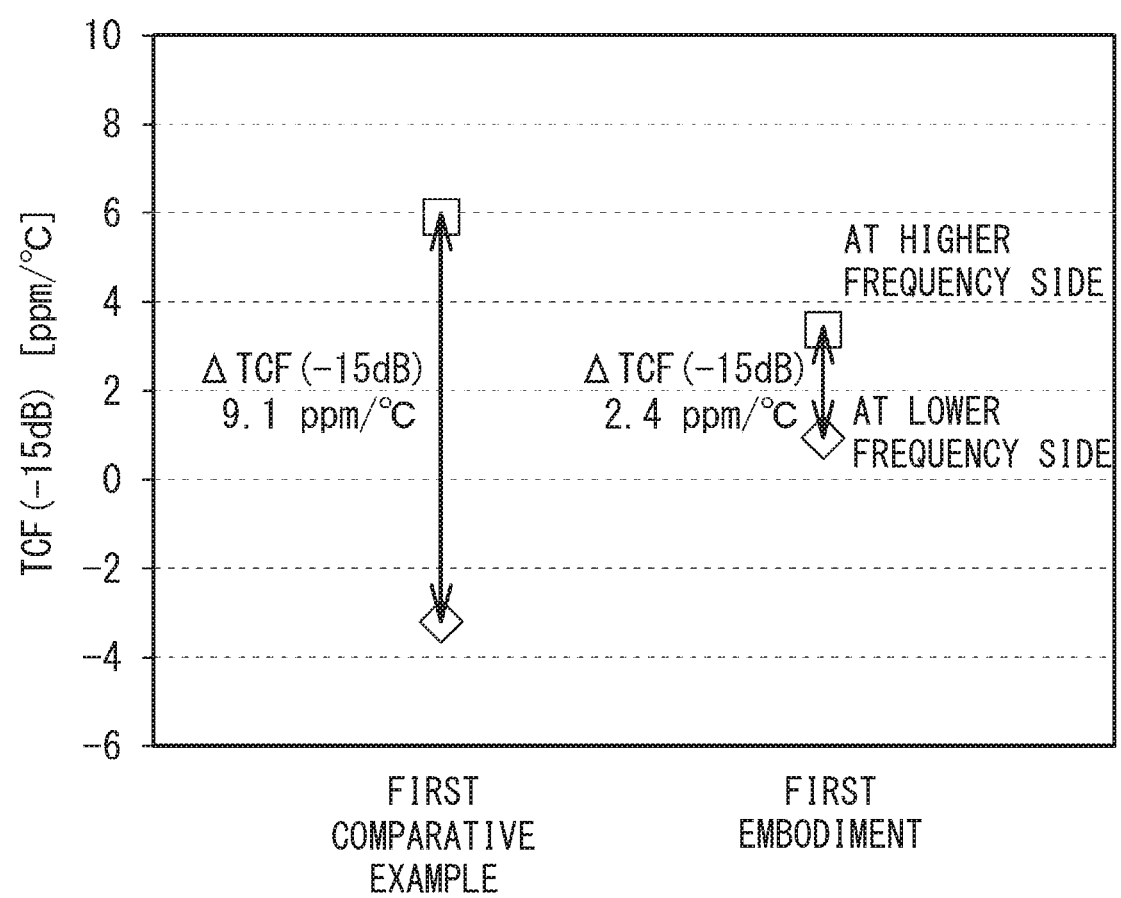
FIG. 12 compares the TCF between the first embodiment and the first comparative example.

In FIG. 6 and FIG. 11, the TCF(−15 dB) at the frequency where the attenuation at the lower-frequency side is −15 dB and the TCF(−15 dB) at the frequency where the attenuation at the higher-frequency side is −15 dB were calculated. FIG. 12 presents the comparison of the TCF between the first embodiment and the first comparative example. As illustrated in FIG. 12, the difference ΔTCF(−15 dB) between the TCF(−15 dB) at the higher-frequency side of the passband and the TCF(−15 dB) at the lower-frequency side of the passband is 9.1 ppm/° C. in the first comparative example, and 2.4 ppm/° C. in the first embodiment. As described above, in the first embodiment, the ΔTCF(−15 dB) is approximately one-fourth of the ΔTCF(−15 dB) in the first comparative example.

In the first comparative example, the dielectric film 14 is located on the piezoelectric substrate 10 so as to cover the electrode fingers 21 of the series resonators S1 through S5 and the parallel resonators P1 through P4. This structure reduces the TCFs of the series resonators S1 through S5 and the parallel resonators P1 through P4. However, the film thickness of the dielectric film 14 (a first dielectric film) covering the electrode fingers 21 (first electrode fingers) in each of the series resonators S1 through S5 is approximately equal to the film thickness of the dielectric film 14 (a second dielectric film) covering the electrode fingers 21 (second electrode fingers) in each of the parallel resonators P1 through P4 to the extent of manufacturing error. Since the pitches of the electrode fingers 21 in the series resonators S1 through S5 are less than the pitches of the electrode fingers 21 in the parallel resonators P1 through P4, the TCFs at the respective resonant frequencies of the series resonators S1 through S5 are less than the TCFs at the respective resonant frequencies of the parallel resonators P1 through P4. Thus, the TCF in the higher-frequency end of the passband of the ladder-type filter is greater than the TCF in the lower-frequency end.

Thus, in the first embodiment, the duty ratio (a second duty ratio) of the electrode fingers 21 in at least one of the parallel resonators P1 through P4 is made to be less than the duty ratio (a first duty ratio) of the electrode fingers 21 in at least one of the series resonators S1 through S5. This structure makes the TCFs at the resonant frequencies of the parallel resonators P1 through P4 of the ladder-type filter large and adjusted to be approximately equal to the TCFs at the resonant frequencies of the series resonators S1 through S4. Thus, the TCF in the higher-frequency end and the TCF in the lower-frequency end of the ladder-type filter are made to be substantially the same. Appropriate selection of the film thickness of the dielectric film 14 enables to make the TCFs in the higher-frequency end and the lower-frequency end approximately 0. As described above, the temperature coefficient of frequency of the ladder-type filter is reduced.

When the number of series resonators is two or more and the number of parallel resonators is two or more, the duty ratios in all the parallel resonators may be less than the duty ratios in all the series resonators. This structure further reduces the temperature coefficient of frequency of the ladder-type filter.

To further adjust the TCFs of the parallel resonator and the series resonator, the duty ratio in the parallel resonator is preferably equal to or less than 0.95 times, more preferably equal to or less than 0.9 times the duty ratio in the series resonator. The difference in duty ratio between the parallel resonator and the series resonator is preferably 1% or greater, more preferably 5% or greater.

A large difference in duty ratio between the parallel resonator and the series resonator affects the filter characteristic. Thus, the duty ratio in the parallel resonator is preferably equal to or greater than 0.6 times, more preferably equal to or greater 0.7 times the duty ratio in the series resonator. The difference in duty ratio between the parallel resonator and the series resonator is preferably 20% or less, more preferably 10% or less.

When the duty ratio varies in one surface acoustic wave resonator, the average of the duty ratio in the surface acoustic wave resonator can be used. The same applies to the pitch.

The dielectric films 14 of the series resonators S1 through S5 and the parallel resonators P1 through P4 are made of substantially the same material to the extent of manufacturing error. Additionally, the dielectric film 14 of each of the series resonators S1 through S5 and the parallel resonators P1 through P4 is a single film. This structure enables to fabricate the dielectric film 14 in the same fabrication process. Thus, the fabrication process is simplified.

A lithium niobate substrate and a lithium tantalate substrate have large negative temperature coefficients of frequency. Thus, the use of the first embodiment is preferable. The lithium niobate substrate may be a rotated Y-cut X-propagation lithium niobate substrate and the lithium tantalate substrate may be a rotated Y-cut X-propagation lithium tantalate substrate.

When the piezoelectric substrate 10 is a lithium niobate substrate and the dielectric film 14 is a silicon oxide film (to which an element such as fluorine may be added), the piezoelectric substrate 10 has a temperature coefficient of elastic modulus that is opposite in sign to that of the dielectric film 14. Thus, the TCF is further reduced. When the rotated Y-cut angle is from 120° to 140°, the Rayleigh wave can be used as a primary mode.

The number of series resonators of the ladder-type filter and the number of parallel resonators can be freely selected.

Second Experiment

A second experiment simulated the relation between the duty ratio and spurious. The simulated resonator has the following configuration: the number of pairs in the IDT is 55 pairs, the number of pairs in the reflector is 10 pairs, and the aperture length is 35λ. Other conditions are the same as those of the first comparative example and the first embodiment. The acoustic wave in the primary mode is a Rayleigh wave, and a Share Horizontal (SH) wave becomes spurious.

Figure 13A:
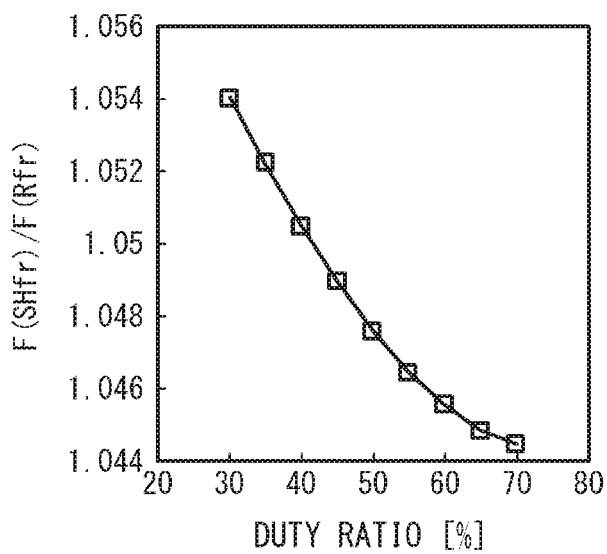
FIG. 13A, FIG. 13B, and FIG. 13C illustrate F(SHfr)/F(Rfr), F(SHfr)/F(Rfa), and $k^2$(SH) with respect to simulated duty ratios in a second experiment, respectively.
Figure 13B:
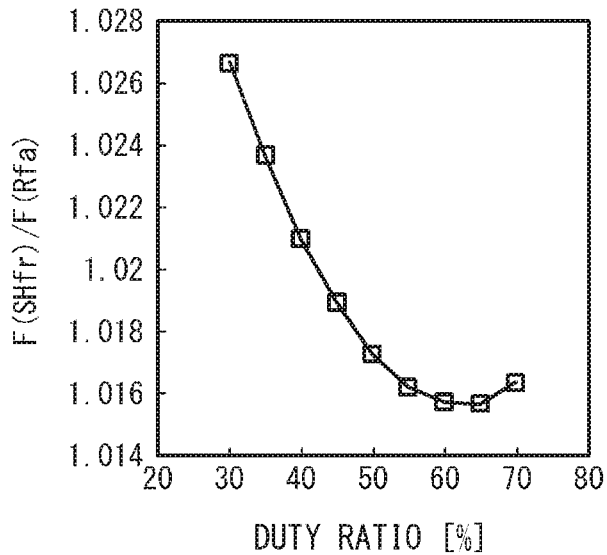
Figure 13C:
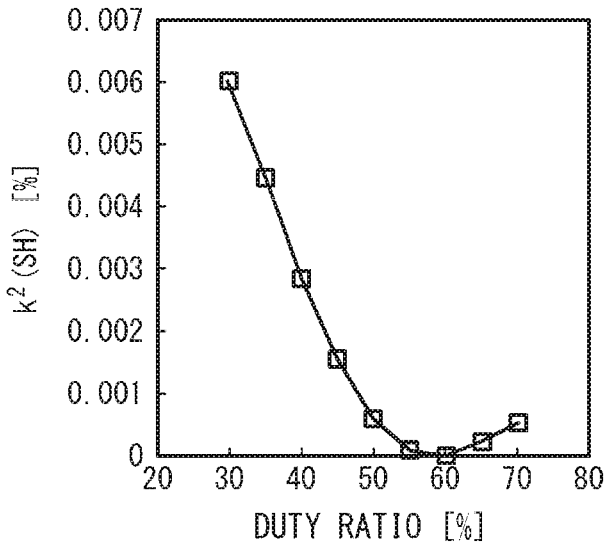

FIG. 13A, FIG. 13B, and FIG. 13C illustrate F(SHfr)/F(Rfr), F(SHfr)/F(Rfa), and $k^2$(SH) with respect to simulated duty ratios in the second experiment, respectively. F(Rfr) and F(Rfa) respectively represent the resonant frequency and the antiresonant frequency of a Rayleigh wave, and F(SHfr) represents the resonant frequency of an SH wave. $k^2$(SH) represents the electromechanical coupling coefficient of the SH wave.

FIG. 13A and FIG. 13B demonstrate that as F(SHfr)/F(Rfr) and F(SHfr)/F(Rfa) becomes farther from 1, the resonant frequency F(SHfr) of the SH wave becomes farther from the resonant frequency F(Rfr) and the antiresonant frequency F(Rfa) of the Rayleigh wave, and the effect of the spurious due to the SH wave is reduced. As demonstrated in FIG. 13A and FIG. 13B, as the duty ratio decreases, F(SHfr)/F(Rfr) and F(SHfr)/F(Rfa) increase, and the effect of spurious is reduced.

As illustrated in FIG. 2B, in the series resonator of the ladder-type filter, the resonant frequency is located within the passband, while in the parallel resonator, the antiresonant frequency is located within the passband. Accordingly, in the series resonator, F(SHfr)/F(Rfr) is preferably away from 1, and in the parallel resonator, F(SHfr)/F(Rfa) is preferably away from 1. Not to form spurious in the passband by the SH wave, F(SHfr)/F(Rfr) is preferably less than 0.991 (F(SHfr)/F(Rfr)<0.991) or F(SHfr)/F(Rfr) is preferably greater than 1.009 (1.009<F(SHfr)/F(Rfr)). F(SHfr)/F(Rfa) is preferably less than 0.991 (F(SHfr)/F(Rfa)<0.991) or F(SHfr)/F(Rfa) is preferably greater than 1.009 (1.009<F(SHfr)/F(Rfa)).

As illustrated in FIG. 13A and FIG. 13B, in the range of the duty ratio from 30% to 70%, F(SHfr)/F(Rfr)>1.044, F(SHfr)/F(Rfa)>1.015, and spurious due to the SH wave is not located in the passband. To make F(SHfr)/F(Rfr) and F(SHfr)/F(Rfa) further away from 1, the duty ratio is preferably 65% or less, more preferably 60% or less.

As illustrated in FIG. 13C, as the duty ratio decreases, $k^2$(SH) increases. To reduce spurious due to the SH wave, $k^2$(SH) is preferably 0.006% or less. As illustrated in FIG. 13C, in the range of the duty ratio from 30% to 70%, $k^2$(SH) is 0.006% or less, and spurious due to the SH wave is very small. To reduce $k^2$(SH), the duty ratio is preferably 40% or greater, more preferably 50% or greater. The duty ratio is preferably 70% or less.

Second Embodiment

Figure 14:
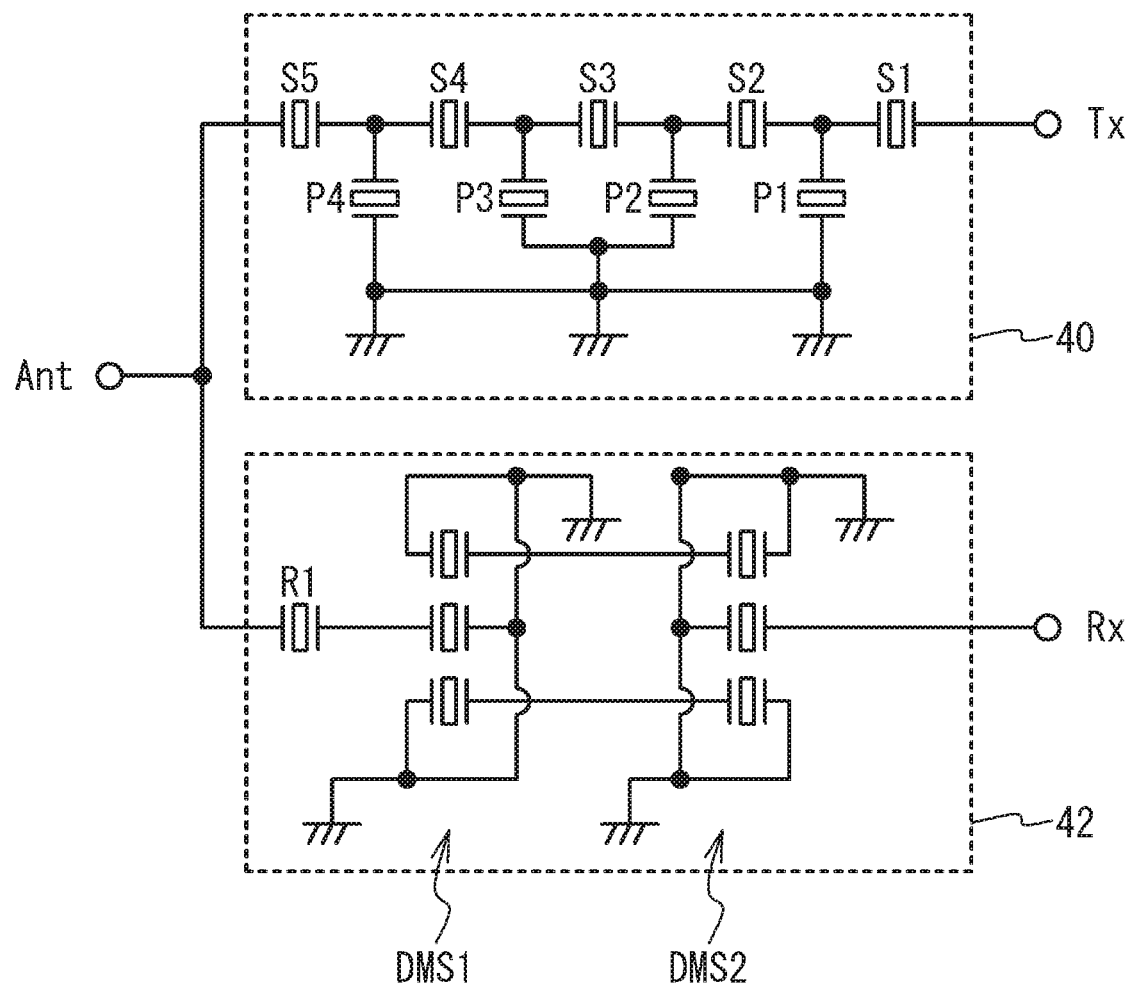
FIG. 14 is a circuit diagram of a duplexer in accordance with a second embodiment.

FIG. 14 is a circuit diagram of a duplexer in accordance with a second embodiment. As illustrated in FIG. 14, a transmit filter 40 is connected between a common terminal Ant and a transmit terminal Tx, and a receive filter 42 is connected between the common terminal Ant and a receive terminal Rx. The transmit filter 40 is the ladder-type filter of the first embodiment. The receive filter 42 includes a one-port resonator R1, double-mode surface acoustic wave filters DMS1 and DMS2 connected in series between the common terminal Ant and the receive terminal Rx.

The transmit filter 40 transmits signals in the transmit band to the common terminal Ant among high-frequency signals input to the transmit terminal Tx, and suppresses signals in other frequency bands. The receive filter 42 transmits signals in the receive band to the receive terminal Rx among high-frequency signals input to the common terminal Ant, and suppresses signals in other frequency bands.

A case where the transmit filter 40 is the acoustic wave filter according to the first embodiment has been described, but it is sufficient if at least one of the transmit filter 40 and the receive filter 42 is the acoustic wave filter according to the first embodiment. The duplexer is described as an example, but it is sufficient if at least one of filters of a multiplexer such as a triplexer, a quadplexer, or the like is the acoustic wave filter according to the first embodiment.

Although the embodiments of the present invention have been described in detail, it is to be understood that the various change, substitutions, and alterations could be made hereto without departing from the spirit and scope of the invention.

What is claimed is:

1. An acoustic wave filter comprising:
   a piezoelectric substrate;
   one or more series resonators that are connected in series between an input terminal and an output terminal and located on the piezoelectric substrate, each of the one or more series resonators including first electrode fingers that are arranged with a first duty ratio and excite an acoustic wave;
   one or more parallel resonators that are connected in parallel between the input terminal and the output terminal and located on the piezoelectric substrate, each of the one or more parallel resonators including second electrode fingers that are arranged with a second duty ratio and excite an acoustic wave, the second duty ratio in each of the one or more parallel resonators being less than the first duty ratio in each of the one or more series resonators; and
   a dielectric film that has a temperature coefficient of elastic modulus that is opposite in sign to that of the piezoelectric substrate, is located on the piezoelectric substrate so as to cover the first electrode fingers and the second electrode fingers, and has a film thickness greater than those of the first electrode fingers and the second electrode fingers,
   wherein:
   each of the one or more series resonators includes a pair of first comb-shaped electrodes, the first duty ratio is a duty ratio in a first region in which third electrode fingers of one of the pair of first comb-shaped electrodes among the first electrode fingers overlap with fourth electrode fingers of another of the pair of first comb-shaped electrodes among the first electrode fingers, the third electrode fingers and the fourth electrode fingers are alternately arranged in the first region, only a single fourth electrode finger among the fourth electrode fingers is located between adjacent third electrode fingers among the third electrode fingers in the first region, only a single third electrode finger among the third electrode fingers is located between adjacent fourth electrode fingers among the fourth electrode fingers in the first region,
   each of the one or more parallel resonators includes a pair of second comb-shaped electrodes, the second duty ratio is a duty ratio in a second region in which fifth electrode fingers of one of the pair of second comb-shaped electrodes among the second electrode fingers overlap with sixth electrode fingers of another of the pair of second comb-shaped electrodes among the second electrode fingers, the fifth electrode fingers and the sixth electrode fingers are alternately arranged in the second region, only a single sixth electrode finger among the sixth electrode fingers is located between adjacent fifth electrode fingers among the fifth electrode fingers in the second region, only a single fifth electrode finger among the fifth electrode fingers is located between adjacent sixth electrode fingers among the sixth electrode fingers in the second region,
   a resonant frequency of each of the one or more parallel resonators is less than a resonant frequency of each of the one or more series resonators,
   an antiresonant frequency of each of the one or more parallel resonators is less than an antiresonant frequency of each of the one or more series resonators,
   no resonator other than the one or more parallel resonators and the one or more series resonators is connected between the input terminal and the output terminal, and
   a difference in value between a value, expressed in percentage, of a largest second duty ratio in the one or more parallel resonators and a value, expressed in percentage, of a smallest first duty ratio in the one or more series resonators is 5% or greater.

2. The acoustic wave filter according to claim 1, wherein the one or more series resonators are a plurality of series resonators,
   the one or more parallel resonators are a plurality of parallel resonators, and
   all of the second duty ratios in the plurality of parallel resonators are less than all of the first duty ratios in the plurality of series resonators.

3. The acoustic wave filter according to claim 1, wherein the difference in value between the value, expressed in percentage, of the largest second duty ratio in the one or more parallel resonators and the value, expressed in percentage, of the smallest first duty ratio in the one or more series resonators is 10% or less.

4. The acoustic wave filter according to claim 1, wherein a pitch of the first electrode fingers is less than a pitch of the second electrode fingers.

5. The acoustic wave filter according to claim 1, wherein the piezoelectric substrate is a lithium niobate substrate or a lithium tantalate substrate.

6. The acoustic wave filter according to claim 1, wherein the piezoelectric substrate is a lithium niobate substrate and the dielectric film is a silicon oxide film.

7. A multiplexer comprising:
   the acoustic wave filter according to claim 1.

8. The acoustic wave filter according to claim 1, wherein the value, expressed in percentage, of the largest second duty ratio in the one or more parallel resonators is equal to or less than 0.9 times the value, expressed in percentage, of the smallest first duty ratio in the one or more series resonators.

9. The acoustic wave filter according to claim 1, wherein the resonant frequency of each of the one or more parallel resonators is lower than a passband of the acoustic wave filter, and the antiresonant frequency of each of the one or more series resonators is higher than the passband.

10. An acoustic wave filter comprising:
    a piezoelectric substrate;
    one or more series resonators that are connected in series between an input terminal and an output terminal and located on the piezoelectric substrate, each of the one or more series resonators including first electrode fingers that are arranged with a first duty ratio and excite an acoustic wave;
    one or more parallel resonators that are connected in parallel between the input terminal and the output terminal and located on the piezoelectric substrate, each of the one or more parallel resonators including second electrode fingers that are arranged with a second duty ratio and excite an acoustic wave, the second duty ratio in each of the one or more parallel resonators being less than the first duty ratio in each of the one or more series resonators;

a first dielectric film that has a temperature coefficient of elastic modulus that is opposite in sign to that of the piezoelectric substrate, is located on the piezoelectric substrate so as to cover the first electrode fingers, and has a first film thickness greater than those of the first electrode fingers; and a second dielectric film that has a temperature coefficient of elastic modulus that is opposite in sign to that of the piezoelectric substrate, is located on the piezoelectric substrate so as to cover the second electrode fingers, and has a second film thickness that is greater than those of the second electrode fingers and is substantially equal to the first film thickness, wherein:

each of the one or more series resonators includes a pair of first comb-shaped electrodes, the first duty ratio is a duty ratio in a first region in which third electrode fingers of one of the pair of first comb-shaped electrodes among the first electrode fingers overlap with fourth electrode fingers of another of the pair of first comb-shaped electrodes among the first electrode fingers, the third electrode fingers and the fourth electrode fingers are alternately arranged in the first region, only a single fourth electrode finger among the fourth electrode fingers is located between adjacent third electrode fingers among the third electrode fingers in the first region, only a single third electrode finger among the third electrode fingers is located between adjacent fourth electrode fingers among the fourth electrode fingers in the first region, each of the one or more parallel resonators includes a pair of second comb-shaped electrodes, the second duty ratio is a duty ratio in a second region in which fifth electrode fingers of one of the pair of second comb-shaped electrodes among the second electrode fingers overlap with sixth electrode fingers of another of the pair of second comb-shaped electrodes among the second electrode fingers, the fifth electrode fingers and the sixth electrode fingers are alternately arranged in the second region, only a single sixth electrode finger among the sixth electrode fingers is located between adjacent fifth electrode fingers among the fifth electrode fingers in the second region, only a single fifth electrode finger among the fifth electrode fingers is located between adjacent sixth electrode fingers among the sixth electrode fingers in the second region, a resonant frequency of each of the one or more parallel resonators is less than a resonant frequency of each of the one or more series resonators, an antiresonant frequency of each of the one or more parallel resonators is less than an antiresonant frequency of each of the one or more series resonators, no resonator other than the one or more parallel resonators and the one or more series resonators is connected between the input terminal and the output terminal, and a difference in value between a value, expressed in percentage, of a largest second duty ratio in the one or more parallel resonators and a value, expressed in percentage, of a smallest first duty ratio in the one or more series resonators is 5% or greater.

11. The acoustic wave filter according to claim 10, wherein the first dielectric film and the second dielectric film are made of substantially identical materials.

12. The acoustic wave filter according to claim 10, wherein
the one or more series resonators are a plurality of series resonators,
the one or more parallel resonators are a plurality of parallel resonators, and
all of the second duty ratios in the plurality of parallel resonators are less than all of the first duty ratios in the plurality of series resonators.

13. The acoustic wave filter according to claim 10, wherein the difference in value between the value, expressed in percentage, of the largest second duty ratio in the one or more parallel resonators and the value, expressed in percentage, of the smallest first duty ratio in the one or more series resonators is 10% or less.

14. The acoustic wave filter according to claim 10, wherein a pitch of the first electrode fingers is less than a pitch of the second electrode fingers.

15. The acoustic wave filter according to claim 10, wherein the piezoelectric substrate is a lithium niobate substrate or a lithium tantalate substrate.

16. The acoustic wave filter according to claim 10, wherein the piezoelectric substrate is a lithium niobate substrate and the dielectric film is a silicon oxide film.

17. A multiplexer comprising:
the acoustic wave filter according to claim 10.

18. The acoustic wave filter according to claim 10, wherein the value, expressed in percentage, of the largest second duty ratio in the one or more parallel resonators is equal to or less than 0.9 times the value, expressed in percentage, of the smallest first duty ratio in the one or more series resonators.

19. The acoustic wave filter according to claim 2, wherein the resonant frequency of each of the one or more parallel resonators is lower than a passband of the acoustic wave filter, and the antiresonant frequency of each of the one or more series resonators is higher than the passband.

* * * * *